United States Patent
Ludwig et al.

[11] Patent Number: 5,903,192
[45] Date of Patent: May 11, 1999

[54] ARRANGEMENT FOR CONTROLLING THE OUTPUT AMPLITUDE OF A HIGH FREQUENCY POWER AMPLIFIER

[75] Inventors: Michael Ludwig, Erbach; Marcus Wahl, Ulm, both of Germany

[73] Assignee: Daimler-Benz Aerospace AG, Germany

[21] Appl. No.: 08/805,242

[22] Filed: Feb. 24, 1997

[30] Foreign Application Priority Data

Feb. 23, 1996 [DE] Germany .................. 196 06 799

[51] Int. Cl.⁶ ................................................. H03G 3/30
[52] U.S. Cl. ..................................... 330/279; 330/285
[58] Field of Search .............................. 330/129, 140, 330/279, 285, 286

[56] References Cited

U.S. PATENT DOCUMENTS 5,051,707  9/1991  Fujita ................................. 330/279
5,712,593  1/1998  Buer et al. ....................... 330/285 X

FOREIGN PATENT DOCUMENTS 0 473 299 A2  3/1992  European Pat. Off. .

Primary Examiner—Steven Mottola
Attorney, Agent, or Firm—Venable; Norman N. Kunitz

[57] ABSTRACT

A controlled, saturated high frequency power amplifier, which can be used especially as a transmitting amplifier in a T/R module for a phase-controlled (radar) antenna for the X-band (8 GHz to 12 GHz). In this case, a portion of the HF output signal is utilized to generate a control signal, with which the output power is controlled nearly without loss via at least one gate connection for the HF power amplifier components, preferably, field effect transistors, that are components of the power amplifier. The power amplifier thus has a high degree of transmitting effectiveness, even with a pulsed transmitting operation.

9 Claims, 3 Drawing Sheets

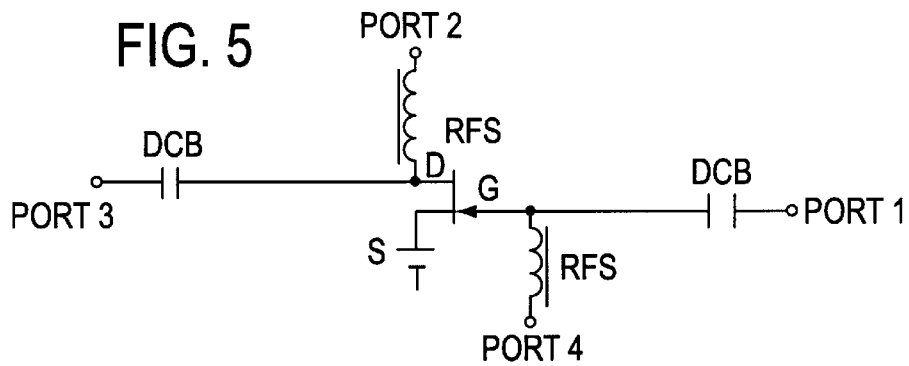
PORT 1; PORT 3 = HF PORTS
PORT 2; PORT 4 = DC PORTS
RFS = RADIO FREQUENCY CHOKE
DCB = DC - BLOCK
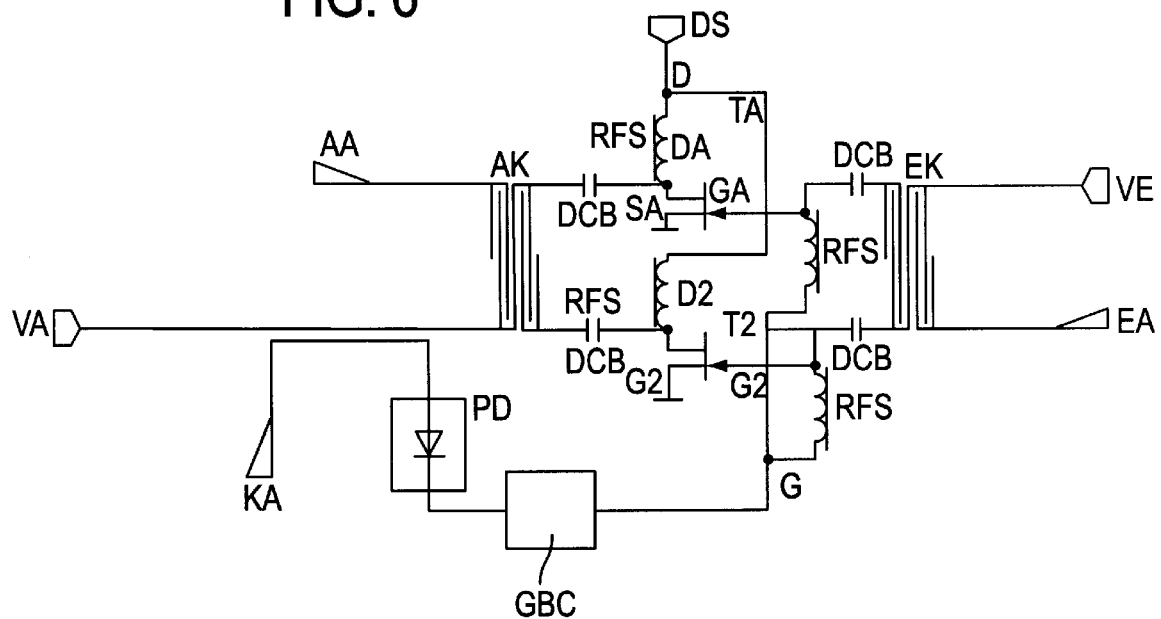

ARRANGEMENT FOR CONTROLLING THE OUTPUT AMPLITUDE OF A HIGH FREQUENCY POWER AMPLIFIER

CROSS REFERENCE TO RELATED APPLICATIONS

This application claims the priority of German Patent Application No. DE 196 06 799.5, filed Feb. 23, 1996, which is incorporated herein by reference.

BACKGROUND OF THE INVENTION

The invention relates to a circuit arrangement for controlling the output amplitude of a high-frequency power amplifier with maximum possible HF power, including a control circuit wherein an actual value signal is generated from the output amplitude using a peak value rectifier, the actual value signal is compared to a desired value signal, a control signal is generated from the actual value/desired value comparison, and this control signal is used to control the output amplitude in accordance with a predetermined value.

The invention is used, for example, for temperature compensation for power amplifiers with a pulse power of approximately 10 Watt for the GHz range (X-band, 8 GHz to 12 GHz). The invention is, however, not limited to this frequency band as well as this performance class.

Such power amplifiers are needed, for example, in radar technology as transmitting amplifiers in transmitting/receiving modules (T/R modules) for phase-controlled antennas. With such T/R modules, the output signal for the power amplifier generally is supplied directly, in particular without a phase and/or an amplitude actuator, to a transmitter or radiator element. For turning and/or forming of the transmitting directional diagram for such an antenna, it is necessary that phase and amplitude states, that are preset as exact as possible, are maintained between the waves emitted by neighboring radiator elements. If a plurality of such T/R modules are used for such an antenna, for example, several thousand, then it is obvious that a high amount of measuring, calibrating as well as balancing is necessary to adjust and/or check the required phase and/or amplitude states. Each T/R module must furthermore incorporate in an unfavorable way the required measuring as well as adjustment options (structural components). Among other things, these have the disadvantage of being susceptible to interference themselves and are not cost-effective.

It is therefore the object of the invention to provide an arrangement of the general type mentioned above, which permits an exact control of the output amplitude of a power amplifier, which can be manufactured with small dimensions, and which is mechanically robust, reliable as well as cost-effective, in particular for an industrial series production.

SUMMARY OF THE INVENTION

The above object generally is achieved according to the invention by a circuit arrangement which comprises: a high frequency power amplifier with maximum possible HF power, and including at least one HF amplifier component having at least a HF input, a HF output, a direct voltage connection and a control voltage connection, with the direct voltage connection being connected to a voltage/current supply unit; and a control circuit for controlling the output amplitude of the at least one HF amplifier component to a predetermined desired value; and wherein the control circuit includes a circuit coupled to the HF output of the amplifier for supplying a signal corresponding to the amplifier output signal to a peak value detector circuit to generate a D.C. actual value signal corresponding to the amplitude of the amplifier output signal, and a gate control circuit for comparing a signal corresponding to the actual value signal and a predetermined desired value signal, which is selected to provide one desired electric value (i.e. output power) of the overall HF amplifier arrangement, to generate a control signal and for supplying the control signal to the control voltage connection of the at least one HF amplifier component.

Advantageous embodiments and/or modifications are likewise described.

A first advantage of the invention is that the arrangement can be produced completely with semiconductor technology, in particular GaAs technology for highest frequency applications.

A second advantage is that even amplitude changes that occur as a result of temperature changes (temperature drift) in the power amplifier can be detected and controlled or compensated.

A third advantage is that the arrangement is highly effective, meaning only a negligible share of dissipation heat is generated additionally by the control. A high degree of effectiveness is particularly advantageous if a plurality of power amplifiers is operated essentially simultaneously, for example, in the T/R modules of an above-mentioned phase-controlled antenna.

Further advantages result from the following description wherein the invention is explained in more detail with the aid of exemplary embodiments and by referring to diagrammatically shown drawings.

BRIEF DESCRIPTION OF THE DRAWINGS

FIG. 5 is a schematic circuit diagram of the four port arrangement of a FET with separated DC and HF ports.

FIG. 6 is a schematic circuit diagram of a balanced power amplifier realized with field effect transistors (FET) and a gate bias control loop.

DETAILED DESCRIPTION OF THE PREFERRED EMBODIMENT

The invention is based on an amplifier arrangement that is suitable in particular as a power amplifier (transmitting amplifier) for the microwave length range, for example, the range of 8 GHz to 12 GHz (X-band). If such amplifiers are used in the T/R modules of a phase-controlled antenna, then these amplifiers should have the highest possible amplitude exactness over a highest possible temperature range (operating range), meaning a predetermined power amplification should always have a tolerance range as low (narrow) as possible in the operating range. A predetermined amplitude exactness can be achieved by use of a control circuit that depends on the amplitude for controlling the amplifier output power (amplitude). If this amplifier is designed as a so-called power amplifier, then an amplitude actuator at the HF input of the amplifier can, for example, be used for this control.

The use of a so-called saturated power amplifiers has proven useful, in particular for use with T/R modules. These preferably operate with the maximum possible (HF) power. This power then only depends on the selected operating voltage and/or the selected operating current. Thus, a control of the operating voltage and/or the operating current in dependence on the output amplitude is necessary for controlling the output power (output amplitude) of such saturated power amplifiers.

Figure 2:
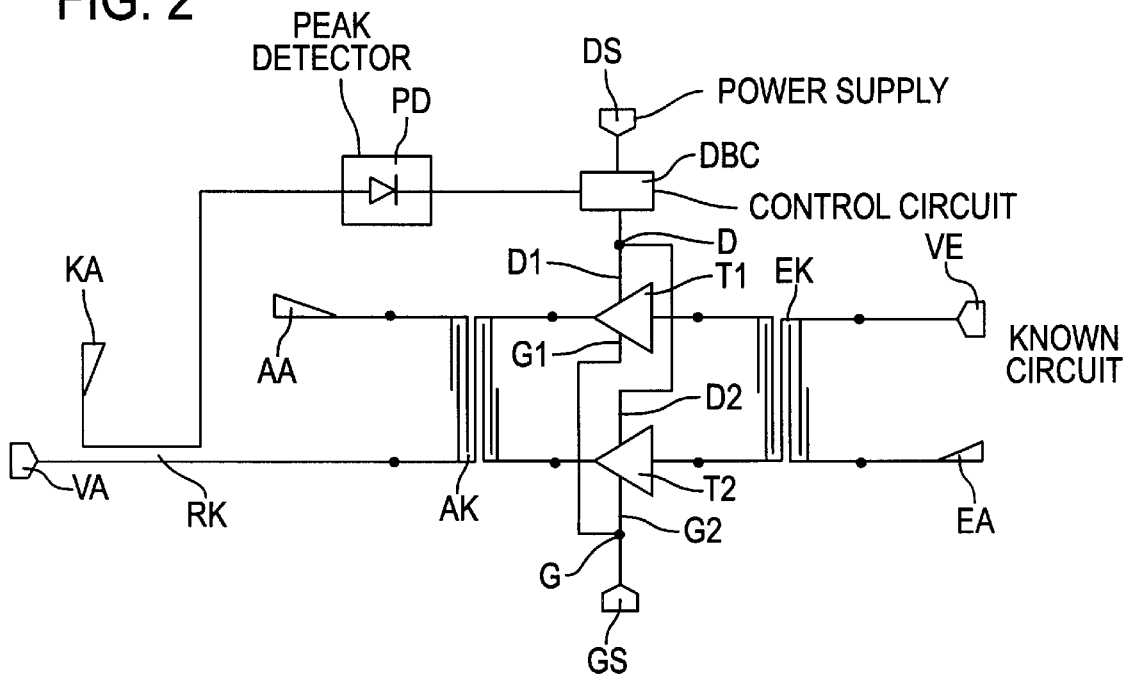
FIG. 2 is a schematic circuit diagram of a known corresponding circuit arrangement.

FIG. 2 shows such a saturated power amplifier, for which the operating voltage is controlled in dependence on the output amplitude. The power amplifier, for example, is composed of two field effect transistors (unipolar transistors) T1, T2, for which the respective gate connections G1, G2 are connected in parallel and the respective drain connections D1, D2 are likewise connected in parallel to form a respective joint (common) gate connection G as well as a respective joint drain connection D for the two transistors. An input signal that is to be amplified, e.g., a radar transmitting signal, travels via the amplifier input VE, an input coupling arrangement EK with input termination EA (HF absorbing layer) to the signal input of two field effect transistors T1, T2, where it is amplified and is then transmitted via an output coupling arrangement AK, with an output termination AA (HF absorbing layer), to the amplifier output VA. For a T/R module, this amplifier output VA essentially can be connected via a transmitting/receiving switch to a transmitting/receiving or transmitter radiator element.

In order to control the output power (output amplitude), a predetermined share or portion, for example, approximately −20 dB, of the output signal is then coupled out at the amplifier output VA by way of a coupler RK, with a termination KA (HF absorption layer), and is rectified in a peak value detector PD. A low-frequency measuring signal (control value) with a direct voltage portion essentially develops at the output of the peak detector PD. This measuring signal corresponds to the amplitude of the output signal at the amplifier output VA. This measuring signal is fed to a drain control circuit DBC, which is arranged between the common drain connection D and a drain-voltage/power supply DS (not regulated). A gate voltage can be fed to the connection referred to as GS, which is used to adjust the operating point for the transistors T1 and T2.

It is obvious that a disadvantageous energy dissipation occurs with such an arrangement in the drain control circuit DBC, because a control would otherwise not be possible. This energy dissipation (heat) disadvantageously requires a technically costly cooling arrangement and also results in a low degree of transmission effectiveness.

Figure 1:
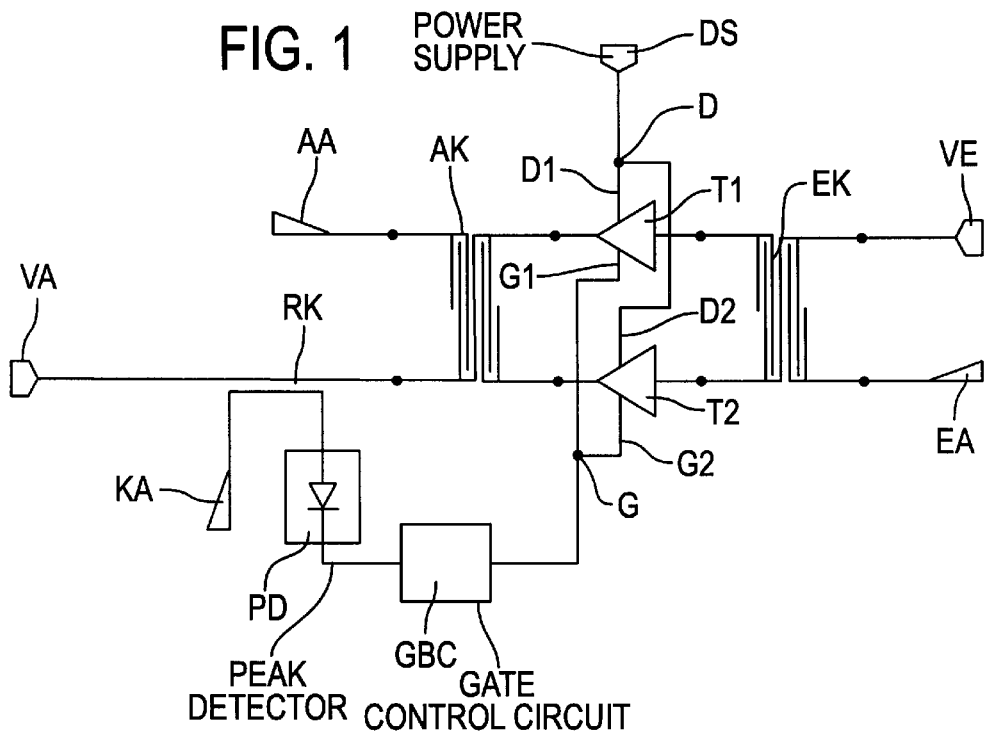
FIG. 1 is a schematic circuit diagram of the preferred embodiment of the circuit arrangement according to the invention.

FIG. 1 shows an embodiment of a circuit arrangement according to the invention, for which a high degree of transmission effectiveness (negligible heat energy dissipation) can be achieved in addition to a high amplitude accuracy. The arrangement shown in FIG. 1 furthermore can be used advantageously for pulsed transmitters, which are presently standard in radar technology, in particular in T/R modules. The circuit arrangement of FIG. 1 essentially differs from the circuit arrangement according to FIG. 2 in that the essentially uncontrolled (or at best only slightly controlled) supply voltage DS is fed directly to the joint drain connection D. The required control of the output power (output amplitude) occurs according to FIG. 1 essentially without (loss) through energy dissipation via a gate control voltage, which is supplied to the joint gate connection G of transistors T1, T2 and thus influences the drain current for transistors T1, T2.

In order to generate the gate control voltage, a predetermined share or portion of the amplifier output signal is coupled out at the amplifier output VA with the aid of a coupler RK, for example, a 20 dB coupler, and is rectified via a voltage doubler circuit PD ("peak detector"). As a result of this, a direct voltage is generated, which corresponds to approximately twice the peak voltage that is present at the amplifier output VA for the example shown here. This direct voltage is used as a control value and is fed to a gate control or balancing circuit GBC. There, a comparison of the desired and actual control values with a predetermined reference value (desired voltage) is made. The control deviation that results from the comparison is amplified, if necessary, and thereby adjusted to the operating parameters for the transistors T1, T2, and is fed to the joint or common gate connection G. This control circuit will be explained in more detail with the aid of FIG. 3 and FIG. 4.

Figure 3:
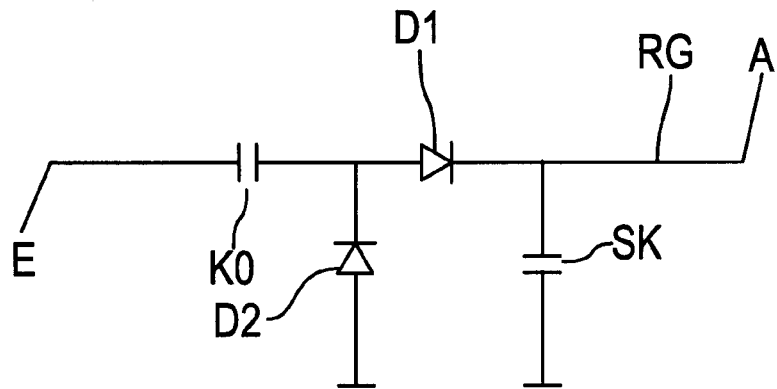
FIG. 3 is a schematic circuit diagram of the peak detector rectifying circuit PD of FIG. 1.

FIG. 3 shows the schematic circuit diagram for the diode voltage doubler circuit PD of FIG. 1. In that case, the HF signal present at the input E via the coupler RK is fed via a coupling capacitor KO to a rectifier, consisting of diodes D1, D2, with the diode Di being connected in the signal path and the diode D2 being connected in shunt. The thereby generated direct voltage (control value) is smoothed by a storage capacitor SK, which is connected in shunt with the signal path and which provides a low-pass effect. The value of the capacitance of capacitor SK depends on the required time constants of the control circuit, with which one skilled in this subject matter is familiar. In addition, the capacitance of capacitor SK can be selected such that even for pulsed transmitting operation (pulsed transmitter), an essentially constant control value RG, which is nearly independent of the pulse length, develops at output A of the peak detecting voltage doubler circuit PD.

This control value RG is then fed to the gate control circuit GBC (FIG. 1). This circuit GBC can be laid out in very different ways in accordance with the control characteristic, for example, as a P controller (proportional controller) according to FIG. 4 by using an operational amplifier.

Figure 4:
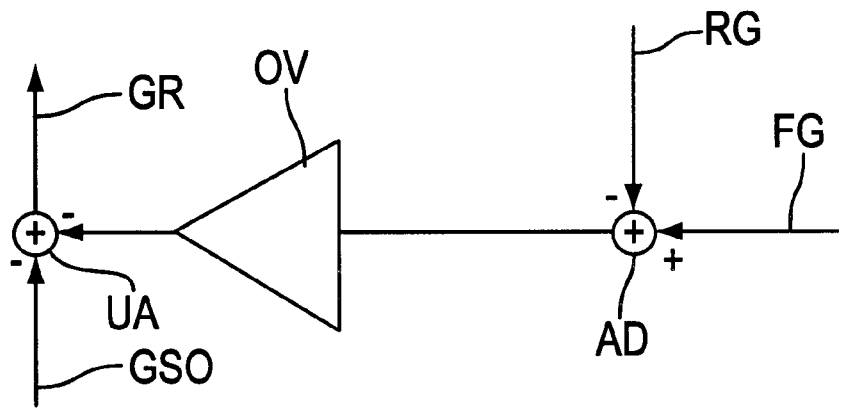
FIG. 4 is a schematic circuit diagram of the gate control circuit GBC of FIG. 1.

In accordance with FIG. 4, the control value RG produced by the doubler circuit PD and present at the input for the operational amplifier OV is compared with a reference value FG, for example an adjustable, well stabilized (reference) direct voltage. In the example shown, this comparison is made by means of an adder stage AD. However, alternatively, this comparison can be made in a known manner by the use of the differential inputs for the operational amplifier OV. A voltage that corresponds to the control deviation is generated at the output for the adder stage AD. This control deviation voltage is amplified in the operational amplifier OV and subsequently supplied to an input of an inverse adder UA. A desired gate voltage GSO for adjusting the operating point of transistors T1, T2 (FIG. 1) is fed to the other input of the inverse adder UA. The voltage GR, generated at the output of the inverse adder UA, is supplied to the joint common gate or control connection G of FIG. 1.

It is possible with such an arrangement, wherein the adder stages AD, UA are also configured as operational amplifiers, to achieve, for example in a temperature range of approximately −40° C. to +60° C. (233K to 333K), an amplitude accuracy of ±0.15 dB for the output amplitude. Without control, only an amplitude accuracy of ±0.6 dB exists in this temperature range.

Thus, the invention is not limited to the exemplary embodiments described, but can be used correspondingly for others, for example, for T/R modules in satellites, wherein a high degree of effectiveness with a high amplitude accuracy over a large temperature range likewise is required.

Furthermore, the invention is not limited to the use of field effect transistors (FET's) as the high frequency (HF) power amplifiers. In principle, all HF amplifier components, which have at least one HF input, one HF output, one direct voltage supply connection as well as a control voltage connection are suitable for this purpose. Such HF amplifier components are, for example, electron beam tubes, so-called HBT's, as well as dual gate FET's. It is not necessary here that the direct and/or control voltage connections as well as the HF input and HF output connections are geometrically separated.

Further uses for HF amplifiers controlled in this way are, for example, in the measuring technology field where very exact HF amplifiers are also needed, as well as for all applications where a compensation of (transistor) manufacturing tolerances is required.

FIG. 5 illustrates the separation of the D.C. ports and the HF ports of an amplifier stage realized with a single stage FET. The radio frequency chokes RFS disconnect the RF signals from the D.C. ports 2 and 4. In a similar way the D.C. blocking capacitors DCB separate the D.C. voltage from the RF ports 1 and 3.

In FIG. 6 the amplifiers $T_1$ and $T_2$ as shown in FIG. 1 are replaced by respective real FET devices $T_1'$ and $T_2'$ illustrated in FIG. 5 and described above.

The invention now being fully described, it will be apparent to one of ordinary skill in the art that any changes and modifications can be made thereto without departing from the spirit or scope of the invention as set forth herein.

What is claimed:

1. A circuit arrangement comprising, in combination:

a high frequency power amplifier operated with maximum possible HF power, and including at least one HF amplifier component having at least a HF input, a HF output, a direct voltage connection and a control voltage connection, with the direct voltage connection being connected to a voltage/current supply unit; and a control circuit for controlling the output amplitude of the at least one HF amplifier component to a predetermined desired value; and wherein said control circuit includes a circuit coupled to the HF output of the amplifier for supplying a signal corresponding to an amplifier output signal to a peak value detector circuit to generate a D.C. actual value signal corresponding to the amplitude of the output signal; and a gate control circuit for comparing a signal corresponding to the actual value signal and a predetermined desired value signal, which is selected to one desired electric value of the overall amplifier arrangement, to generate a control signal and for supplying the control signal to the control voltage connection of the at least one HF amplifier component.

2. The circuit arrangement defined in claim 1, wherein the control signal is formed in said gate control circuit by an operational amplifier, which is connected as a proportional controller.

3. The circuit arrangement defined in claim 2, wherein said operational amplifier provides an output signal corresponding to an amplified difference signal between said signal corresponding to the actual value signal and a predetermined reference value; and further including an inverse adder for comparing the output signal of the operational amplifier and the desired value to provide the control signal.

4. The circuit arrangement defined in claim 1, wherein the peak value detector circuit is a voltage doubler circuit with a one-way rectification and using two diodes.

5. The circuit arrangement defined in claim 1, wherein the circuit arrangement is a controlled power amplifier for the radar frequency range.

6. The circuit arrangement defined in claim 1 wherein the circuit arrangement is a controlled transmitting amplifier for the X-band.

7. The circuit arrangement defined in claim 1 wherein the circuit arrangement is disposed in a transmitting/receiving module (T/R module) for a phase-controlled antenna.

8. The circuit arrangement defined in claim 1, wherein the at least one HF amplifier component is a field effect transistor.

9. The circuit arrangement defined in claim 8, wherein the at least one field effect transistor, the peak value detector, and the gate control circuit are formed with semiconductor technology suitable for the X-band.

* * * * *